United States Patent
Nakazawa et al.

(10) Patent No.: US 11,728,783 B2
(45) Date of Patent: Aug. 15, 2023

(54) ACOUSTIC WAVE DEVICE AND COMPOSITE FILTER APPARATUS

(71) Applicant: Murata Manufacturing Co., Ltd., Nagaokakyo (JP)

(72) Inventors: Hidetaro Nakazawa, Nagaokakyo (JP); Hideki Iwamoto, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 327 days.

(21) Appl. No.: 17/198,464

(22) Filed: Mar. 11, 2021

(65) Prior Publication Data

US 2021/0328576 A1     Oct. 21, 2021

(30) Foreign Application Priority Data

Apr. 17, 2020   (JP) .................. 2020-074255

(51) Int. Cl.
*H03H 9/02* (2006.01)
*H03H 9/54* (2006.01)
*H03H 9/13* (2006.01)
*H03H 9/17* (2006.01)

(52) U.S. Cl.
CPC .... *H03H 9/02574* (2013.01); *H03H 9/02559* (2013.01); *H03H 9/13* (2013.01); *H03H 9/176* (2013.01); *H03H 9/54* (2013.01)

(58) Field of Classification Search
CPC ............ H03H 9/54; H03H 9/13; H03H 9/176; H03H 9/02559; H03H 9/02834; H03H 9/725; H03H 9/02574; H03H 9/64; H03H 9/05; H03H 9/14541; H03H 9/25; H03H 9/72
USPC ......................................... 333/133, 193–196
See application file for complete search history.

(56) References Cited

U.S. PATENT DOCUMENTS

| | | |
|---|---|---|
| 2013/0285768 A1 | 10/2013 | Watanabe et al. |
| 2019/0260347 A1* | 8/2019 | Takai ................ H04B 1/40 |
| 2020/0007109 A1 | 1/2020 | Nakagawa et al. |

FOREIGN PATENT DOCUMENTS

| | | |
|---|---|---|
| JP | 2015-073331 A | 4/2015 |
| WO | 2018/164210 A1 | 9/2018 |

* cited by examiner

*Primary Examiner* — Rakesh B Patel
*Assistant Examiner* — Jorge L Salazar, Jr.
(74) *Attorney, Agent, or Firm* — Keating & Bennett, LLP (57) ABSTRACT

An acoustic wave device includes a (111)-oriented silicon substrate, a silicon nitride layer, a silicon oxide layer, a lithium tantalate layer, and an IDT electrode on the lithium tantalate layer. When the wavelength determined by the electrode finger pitch of the IDT electrode is λ, the thickness of the silicon nitride layer, SiN [λ], the thickness of the silicon oxide layer, SiO₂ [λ], the thickness of the lithium tantalate layer, LT [λ], and one of the Euler angles of the lithium tantalate layer, LTθ [deg.], are thicknesses and an angle in ranges in which the phase of a first higher-order mode is about −20° or less.

20 Claims, 8 Drawing Sheets

ACOUSTIC WAVE DEVICE AND COMPOSITE FILTER APPARATUS

CROSS REFERENCE TO RELATED APPLICATIONS

This application claims the benefit of priority to Japanese Patent Application No. 2020-074255 filed on Apr. 17, 2020. The entire contents of this application are hereby incorporated herein by reference.

BACKGROUND OF THE INVENTION

1. Field of the Invention

The present invention relates to acoustic wave devices and composite filter apparatuses.

2. Description of the Related Art

In the related art, acoustic wave devices are widely used in applications such as filters for cellular phones. International Publication No. 2018/164210 discloses an example of an acoustic wave device. This acoustic wave device includes a silicon oxide film disposed on a support substrate formed of silicon, a piezoelectric film disposed on the silicon oxide film, and an interdigital transducer (IDT) electrode disposed on the piezoelectric film. The support substrate is (100)-, (110)-, or (111)-oriented.

In the acoustic wave device described in International Publication No. 2018/164210, a higher-order mode at a frequency of 1.5 times the resonant frequency is reduced or prevented. However, a higher-order mode at a frequency of 2.2 times the resonant frequency cannot be sufficiently reduced or prevented.

SUMMARY OF THE INVENTION

Preferred embodiments of the present invention provide acoustic wave devices and composite filter apparatuses in each of which a higher-order mode at a frequency of about 2.2 times the resonant frequency is able to be sufficiently reduced or prevented.

According to a preferred embodiment of the present invention, an acoustic wave device includes a (111)-oriented silicon substrate, a silicon nitride layer on the silicon substrate, a silicon oxide layer on the silicon nitride layer, a lithium tantalate layer on the silicon oxide layer, and an IDT electrode on the lithium tantalate layer. The acoustic wave device has a resonant frequency. When the wavelength determined by the electrode finger pitch of the IDT electrode is λ, the thickness of the silicon nitride layer is SiN [λ], the thickness of the silicon oxide layer is SiO$_2$ [λ], the thickness of the lithium tantalate layer is LT [λ], and the Euler angles of the lithium tantalate layer are (LTφ [deg.], LTθ [deg.], LTψ [deg.]), SiN [λ], SiO$_2$ [λ], LT [λ], and LTθ [deg.] are thicknesses and an angle in ranges in which the phase of a first higher-order mode is about −20° or less as derived from the following equation:

$$\begin{aligned}\text{phase[deg.]} =\ &6047.63520371535 - 3073.77179344486 \times (\text{``}LT[\lambda]\text{''}) - 150.043164693716 \times (\text{``}LT\theta[\text{deg.}]\text{''}) \\&+ 85.8474275079871 \times \text{``SiO}_2[\lambda]\text{''}) \\&+ 122.520263077834 \times (\text{``SiN}[\lambda]\text{''}) \\&+ 13410.0503377046 \times (\text{``}LT[\lambda]\text{''})^2 \\&- 22919.3322354524 \times (\text{``}LT[\lambda]\text{''})^3 \\&+ 1.23679341913702 \times (\text{``}LT\theta[\text{deg.}]\text{''})^2 \\&- 0.00339999845069541 \times (\text{``}LT\theta[\text{deg.}]\text{''})^3 \\&+ 8.82482069182538 \times (\text{``}LT[\lambda]\text{''}) \times (\text{``}LT\theta[\text{deg.}]\text{''}) \\&- 693.691058668391 \times (\text{``}LT[\lambda]\text{''}) \times (\text{``SiN}[\lambda]\text{''})\end{aligned} \quad \text{equation 1.}$$

According to a preferred embodiment of the present invention, a composite filter apparatus includes a common connection terminal, a first filter unit including an acoustic wave device according to a preferred embodiment of the present invention and having a first pass band, and a second filter unit connected in common with the first filter unit to the common connection terminal and having a second pass band different from the first pass band. A second higher-order mode is excited at a frequency of from about 1.2 times to about 1.7 times the resonant frequency of the acoustic wave device. The frequency of the second higher-order mode is located outside the second pass band.

According to a preferred embodiment of the present invention, a composite filter apparatus includes a common connection terminal, a first filter unit including an acoustic wave device according to a preferred embodiment of the present invention and having a first pass band, and a second filter unit connected in common with the first filter unit to the common connection terminal and having a second pass band that is a frequency band lower than the first pass band. A Rayleigh wave is excited at a frequency lower than the resonant frequency of the acoustic wave device. The frequency of the Rayleigh wave is located outside the second pass band.

In the acoustic wave devices and the composite filter apparatuses according to preferred embodiments of the present invention, a higher-order mode at a frequency of about 2.2 times the resonant frequency is able to be sufficiently reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will hereinafter be described with reference to the drawings to clarify the present invention.

It is noted that the preferred embodiments described herein are merely illustrative, and partial substitutions and combinations of configurations are possible between different preferred embodiments.

Figure 1:
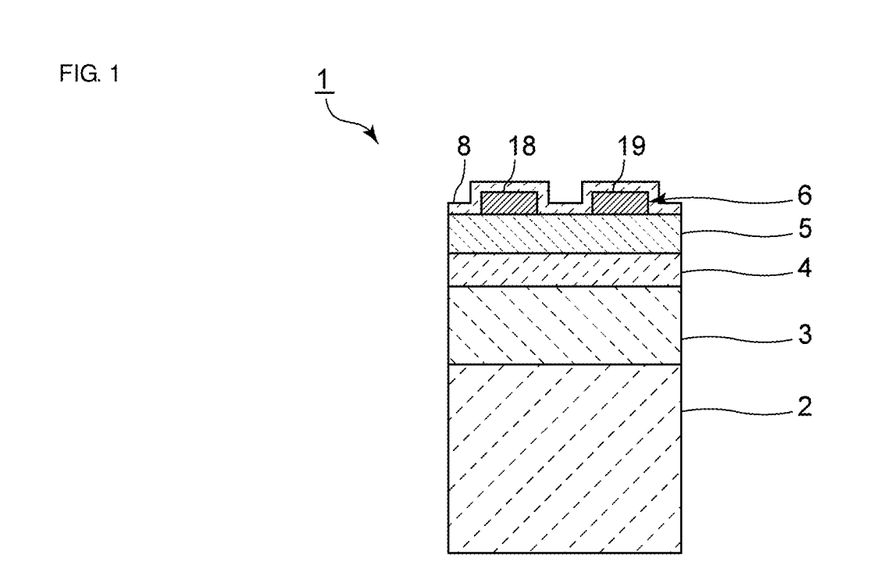
FIG. 1 is a front sectional view illustrating a portion of an acoustic wave device according to a first preferred embodiment of the present invention.
Figure 2:
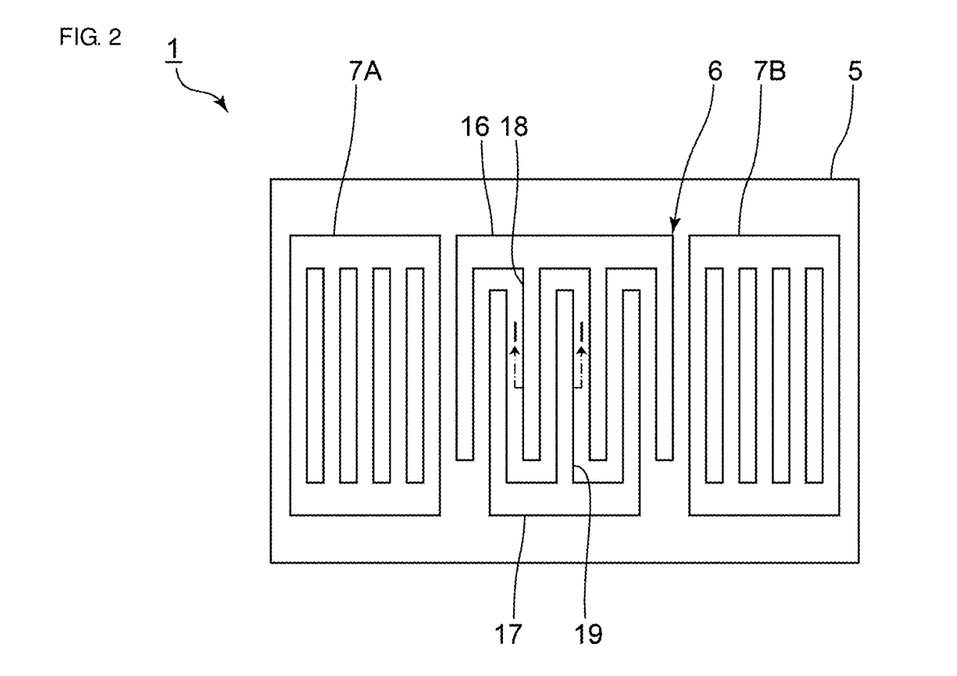
FIG. 2 is a plan view of the acoustic wave device according to the first preferred embodiment of the present invention.

FIG. 1 is a front sectional view illustrating a portion of an acoustic wave device according to a first preferred embodiment of the present invention. FIG. 2 is a plan view of the acoustic wave device according to the first preferred embodiment. FIG. 1 is a sectional view taken along line I-I in FIG. 2. In FIG. 2, a dielectric film described later is omitted.

As illustrated in FIG. 1, an acoustic wave device 1 includes a silicon substrate 2, a silicon nitride layer 3, a silicon oxide layer 4, and a lithium tantalate layer 5. More specifically, the silicon nitride layer 3 is disposed on the silicon substrate 2. The silicon oxide layer 4 is disposed on the silicon nitride layer 3. The lithium tantalate layer 5 is disposed on the silicon oxide layer 4.

An IDT electrode 6 is disposed on the lithium tantalate layer 5. An alternating voltage is applied to the IDT electrode 6 to excite an acoustic wave. As illustrated in FIG. 2, a pair of reflectors 7A and 7B are disposed on the lithium tantalate layer 5 on both sides of the IDT electrode 6 in the acoustic wave propagation direction. The acoustic wave device 1 is a surface acoustic wave resonator having a resonant frequency. In the present preferred embodiment, a plurality of modes are excited in addition to the main mode.

Figure 3:
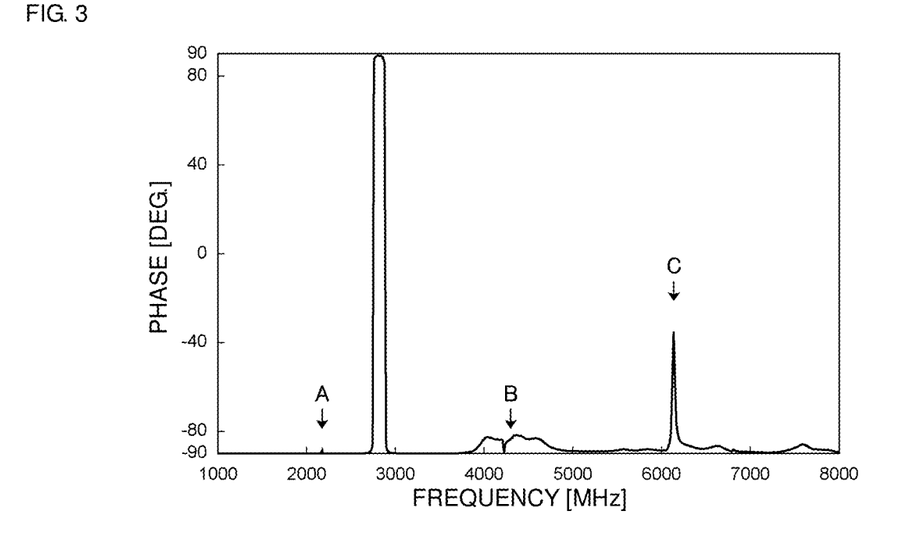
FIG. 3 is a graph illustrating an example relationship between a main mode and unnecessary waves.

FIG. 3 is a graph illustrating an example relationship between the main mode and unnecessary waves. In FIG. 3, the arrow A indicates a frequency of about 0.7 times the resonant frequency, the arrow B indicates a frequency of about 1.5 times the resonant frequency, and the arrow C indicates a frequency of about 2.2 times the resonant frequency. The same applies to other figures illustrating phase characteristics.

In the example illustrated in FIG. 3, the resonant frequency is around 2,800 MHz. The main mode is excited at the resonant frequency. As indicated by the arrow A in FIG. 3, a Rayleigh wave is excited at a frequency lower than the resonant frequency. More specifically, in the present preferred embodiment, a Rayleigh wave is excited at a frequency of about 0.7 times the resonant frequency. As indicated by the arrow B, a higher-order mode is excited at a frequency of about 1.5 times the resonant frequency. As indicated by the arrow C, another higher-order mode is excited at a frequency of about 2.2 times the resonant frequency. The Rayleigh wave and the higher-order modes are unnecessary waves for the acoustic wave device 1.

In the present preferred embodiment, a higher-order mode at a frequency of from about 2.0 times to about 2.5 times the resonant frequency is referred to as "first higher-order mode", and a higher-order mode at a frequency of from about 1.2 times to about 1.7 times the resonant frequency is referred to as "second higher-order mode". The frequencies at which the first higher-order mode, the second higher-order mode, and the Rayleigh wave occur are not limited to the above. The first higher-order mode occurs at a higher frequency than the second higher-order mode. The Rayleigh wave occurs at a frequency lower than the resonant frequency.

For example, if a plurality of second higher-order modes are present in or outside a frequency range from about 1.2 times to about 1.7 times the resonant frequency, the term "second higher-order mode" as used herein refers to a higher-order mode having the maximum phase among the second higher-order modes.

As illustrated in FIG. 2, the IDT electrode 6 includes a first busbar 16, a second busbar 17, a plurality of first electrode fingers 18, and a plurality of second electrode fingers 19. The first busbar 16 and the second busbar 17 are opposed to each other. The plurality of first electrode fingers 18 are each connected at one end to the first busbar 16. The plurality of second electrode fingers 19 are each connected at one end to the second busbar 17. The plurality of first electrode fingers 18 and the plurality of second electrode fingers 19 interdigitate with each other.

The IDT electrode 6 is, for example, an aluminum electrode. The reflector 7A and the reflector 7B are made of, for example, a material including aluminum as a main component. However, the materials for the IDT electrode 6, the reflector 7A, and the reflector 7B are not limited to the above. The IDT electrode 6, the reflector 7A, and the reflector 7B may be a single-layer metal film or a multilayer metal film.

A dielectric film 8 is disposed over the lithium tantalate layer 5 so as to cover the IDT electrode 6, the reflector 7A, and the reflector 7B. In the present preferred embodiment, the dielectric film 8 is preferably a silicon oxide film, for example. In this case, the absolute value of the temperature coefficient of frequency (TCF) of the acoustic wave device 1 can be reduced, thus improving the frequency-temperature characteristics. However, the material for the dielectric film 8 is not limited to the above. For example, silicon nitride or silicon oxynitride can also be used. The acoustic wave device 1 may not include the dielectric film 8.

Figure 4:
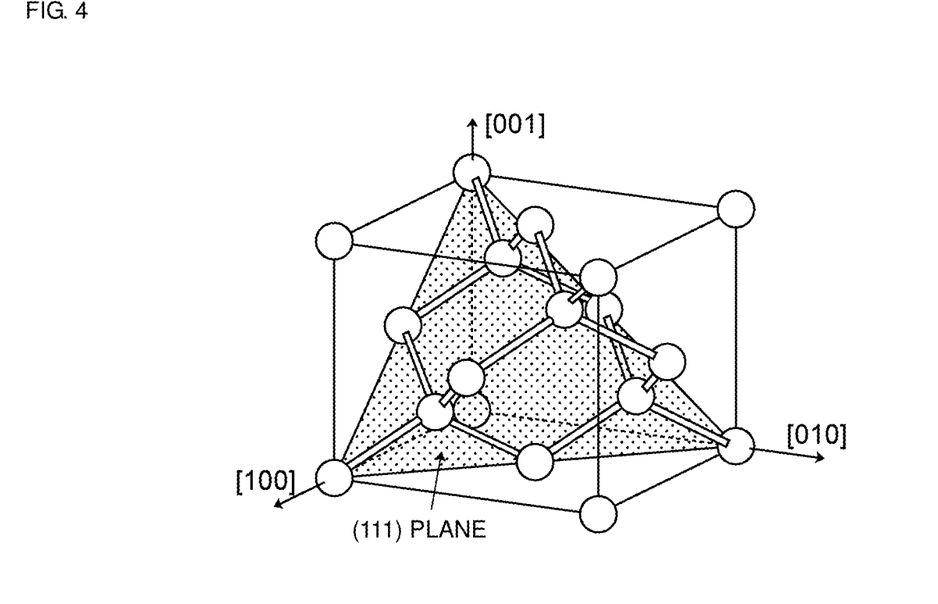
FIG. 4 is a schematic view illustrating the (111) plane of silicon.

Referring back to FIG. 1, the silicon substrate 2 is preferably a single-crystal silicon substrate, for example. As illustrated in FIG. 4, silicon has a diamond structure. The silicon substrate 2 in the present preferred embodiment is (111)-oriented. The term "(111)-oriented" refers to a substrate obtained by cutting the diamond crystal structure of silicon in the (111) plane, which is orthogonal or substantially orthogonal to the crystal axis indicated by the miller index [111]. The (111) plane is a plane illustrated in FIG. 4. Silicon has three-fold in-plane symmetry in the (111) plane and exhibits an equivalent crystal structure when rotated by 120°.

The Euler angles of the silicon substrate 2 are (−45°, −54.7°, Siψ [deg.]). On the other hand, the Euler angles of the lithium tantalate layer 5 are (LTφ [deg.], LTθ [deg.], LTψ [deg.]). LTθ [deg.] and Siψ [deg.] may hereinafter be referred to as "LTθ" and "Siψ", with the unit [deg.] omitted.

In the present preferred embodiment, the silicon nitride layer 3 is preferably a SiN layer, for example. The silicon oxide layer 4 is preferably a SiO₂ layer, for example. The lithium tantalate layer 5 is preferably a LiTaO₃ layer, for example. Here, the wavelength determined by the electrode finger pitch of the IDT electrode 6 is $\lambda$. The thickness of the silicon nitride layer 3 is SiN [$\lambda$]. The thickness of the silicon oxide layer 4 is SiO₂ [$\lambda$]. The thickness of the lithium tantalate layer 5 is LT [$\lambda$]. The thickness of the IDT electrode 6 is Al [$\lambda$]. Here, the silicon oxide layer 4 may include an intermediate layer made of a material such as, for example, titanium, nickel, or silicon in the silicon oxide layer 4. In this case, the thickness of the silicon oxide layer 4 refers to the thickness of the silicon oxide layer 4 including the intermediate layer. The inventors of preferred embodiments of the present invention have discovered that the phase of the first higher-order mode is derived from equation 1.

$$\begin{aligned}\text{phase[deg.]} =\ & 6047.63520371535 - 3073.77179344486 \times \\ & (\text{``}LT[\lambda]\text{''}) - 150.043164693716 \times (\text{``}LT\theta[\text{deg.}]\text{''}) + \\ & 85.8474275079871 \times (\text{``}SiO_2[\lambda]\text{''}) + \\ & 122.520263077834 \times (\text{``}SiN[\lambda]\text{''}) + \\ & 13410.0503377046 \times (\text{``}LT[\lambda]\text{''})^2 - \\ & 22919.3322354524 \times (\text{``}LT[\lambda]\text{''})^3 + \\ & 1.23679341913702 \times (\text{``}LT\theta[\text{deg.}]\text{''})^2 - \\ & 0.00339999845069541 \times (\text{``}LT\theta[\text{deg.}]\text{''})^3 + \\ & 8.82482069182538 \times (\text{``}LT[\lambda]\text{''}) \times (\text{``}LT\theta[\text{deg.}]\text{''}) - \\ & 693.691058668391 \times (\text{``}LT[\lambda]\text{''}) \times (\text{``}SiN[\lambda]\text{''})\end{aligned} \quad \text{equation 1}$$

The present preferred embodiment is characterized by having the following configuration: 1) the silicon substrate 2 is (111)-oriented; and 2) SiN [$\lambda$], SiO₂ [$\lambda$], LT [$\lambda$], and LT$\theta$ [deg.] are thicknesses and an angle in ranges in which the phase of the first higher-order mode as derived from equation 1 is about −20 [deg.] or less. This enables the first higher-order mode at a frequency of about 2.2 times the resonant frequency to be sufficiently reduced or prevented. The above advantageous effects will hereinafter be described in detail together with equation 1.

The phase characteristics of an acoustic wave device 1 having the configuration of the present preferred embodiment and having the following design parameters were measured.

Silicon substrate 2: material . . . single-crystal Si; plane orientation . . . (111); Euler angles . . . (about −45°, about −54.7°, about) 30°)

Silicon nitride layer 3: material . . . SiN; thickness SiN [$\lambda$] . . . about 650 nm Silicon oxide layer 4: material . . . SiO₂; thickness SiO₂ [$\lambda$] . . . about 200 nm Lithium tantalate layer 5: material . . . 30Y—LiTaO₃; thickness LT [$\lambda$] . . . about 200 nm; Euler angle LT$\theta$ [deg.] . . . about 120°

IDT electrode 6: material . . . Al; thickness Al [$\lambda$] . . . 100 nm; wavelength $\lambda$ . . . about 1.4 μm FIG. 5 is a graph illustrating the phase characteristics of the acoustic wave device according to the first preferred embodiment.

Figure 5:
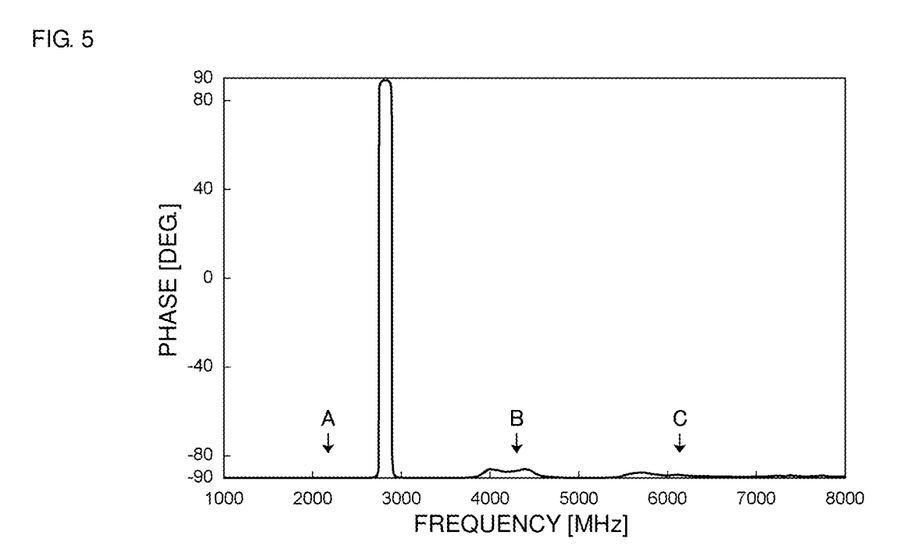
FIG. 5 is a graph illustrating the phase characteristics of the acoustic wave device according to the first preferred embodiment of the present invention.

As indicated by the arrow C in FIG. 5, it is demonstrated that the first higher-order mode is effectively reduced or prevented in the present preferred embodiment.

The derivation of equation 1 will hereinafter be described in detail. The design parameters of the acoustic wave device 1 were varied in the ranges presented below, and the phase of the first higher-order mode was measured for each case.

Si$\psi$ [deg.]: varied in a range from 0 [deg.] to 60 [deg.] in units of 10 [deg.]

SiN [$\lambda$]: varied in a range from about 50 nm to about 850 nm in units of 50 nm SiO₂ [$\lambda$]: varied in a range from about 100 nm to about 500 nm in units of 50 nm LT [$\lambda$]: about 100 nm, or varied in a range from about 200 nm to about 500 nm in units of 50 nm LT$\theta$ [deg.]: varied in a range from about 100° to about 135° in units of 5°

Al [$\lambda$]: about 100 nm, about 130 nm, about 140 nm, or about 160 nm

Wavelength $\lambda$ of IDT electrode 6: about 1.4 μm or about 2 μm

Equation 1 above was derived from the results. In the acoustic wave device 1, SiN [$\lambda$], SiO₂ [$\lambda$], LT [$\lambda$], and LT$\theta$ [deg.] are thicknesses and an angle in ranges in which the phase of the first higher-order mode as derived from equation 1 is about −20° or less. Thus, the phase of the first higher-order mode can be reliably reduced or prevented to about −20° or less. Here, the relationships between SiO₂ [$\lambda$] and the phase and velocity of the first higher-order mode are presented.

Figure 6:
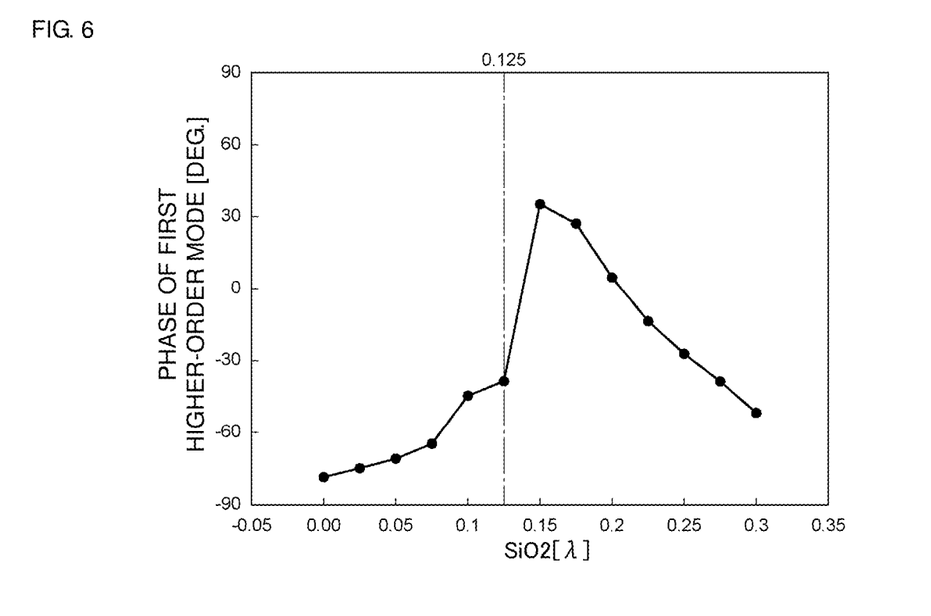
FIG. 6 is a graph illustrating the relationship between the thickness of a silicon oxide layer, SiO$_2$ [λ], and the phase of a first higher-order mode.
Figure 7:
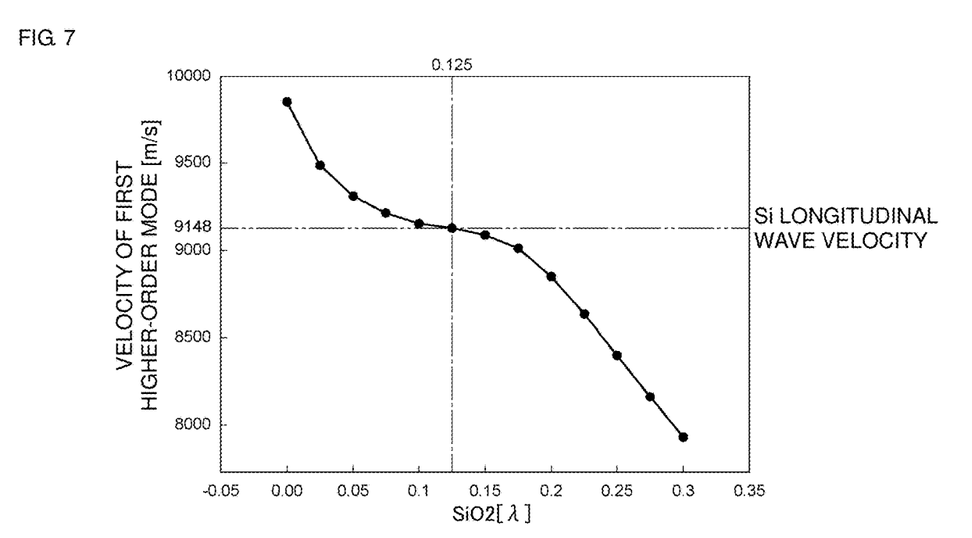
FIG. 7 is a graph illustrating the relationship between the thickness of the silicon oxide layer, SiO$_2$ [λ], and the velocity of the first higher-order mode.

FIG. 6 is a graph illustrating the relationship between the thickness of the silicon oxide layer, SiO₂ [$\lambda$], and the phase of the first higher-order mode. FIG. 7 is a graph illustrating the relationship between the thickness of the silicon oxide layer, SiO₂ [$\lambda$], and the velocity of the first higher-order mode. The two-dot chain line in FIG. 7 indicates the Si longitudinal wave velocity, namely, 9,148 m/s. The Si longitudinal wave velocity is the bulk wave velocity of a longitudinal wave propagating through the silicon substrate 2.

As illustrated in FIG. 6, if the thickness of the silicon oxide layer 4, SiO₂ [$\lambda$], is less than about 0.15$\lambda$, the phase of the first higher-order mode can be reduced. If SiO₂ [$\lambda$] is about 0.125$\lambda$ or less, the phase of the first higher-order mode can be effectively reduced. This is because, if SiO₂ [$\lambda$] falls within that range, the first higher-order mode becomes a leaky mode. More specifically, as illustrated in FIG. 7, if SiO₂ [$\lambda$] is about 0.125$\lambda$ or less, the velocity of the higher-order mode is higher than the Si longitudinal wave velocity. Thus, the first higher-order mode can be effectively allowed to leak to the silicon substrate 2 side, and accordingly, the phase of the first higher-order mode can be effectively reduced.

The acoustic wave device 1 can be used, for example, in a filter unit, such as a band pass filter. The acoustic wave device 1 may also be used as a series arm resonator or a parallel arm resonator in a ladder filter. Alternatively, the acoustic wave device 1 may be used as an acoustic wave resonator in a filter unit including a longitudinally coupled resonator acoustic wave filter. The filter unit in which the acoustic wave device 1 is used may have any suitable circuit configuration. If the acoustic wave device 1 is used in a filter unit, a decrease in attenuation can be reduced or prevented. This advantageous effect will hereinafter be described in detail.

The phase of the first higher-order mode at a frequency of about 2.2 times the resonant frequency was measured with the SiN [$\lambda$], SiO₂ [$\lambda$], LT [$\lambda$], and LT$\theta$ [deg.] of the acoustic wave device being varied. The attenuation-frequency characteristics of the filter unit including the acoustic wave device under the conditions where the phase was measured were measured. The decrease in attenuation due to the first higher-order mode at a frequency of about 2.2 times the resonant frequency was calculated with respect to simulation data in a case where no first higher-order mode occurred.

Figure 8:
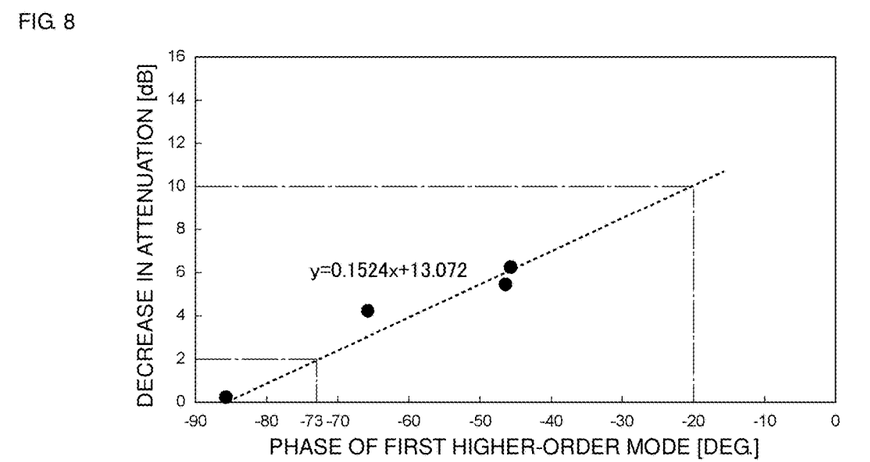
FIG. 8 is a graph illustrating the relationship between the phase of the first higher-order mode and a decrease in attenuation in a filter unit.

FIG. 8 is a graph illustrating the relationship between the phase of the first higher-order mode and the decrease in attenuation in the filter unit.

As illustrated in FIG. 8, it is demonstrated that there is a proportional relationship between the phase of the first higher-order mode in the acoustic wave device and the decrease in attenuation in the filter unit. Specifically, the above proportional relationship is expressed as y=0.1524x+13.072, where y is the decrease in attenuation, and x is the phase of the first higher-order mode. In the first preferred embodiment, the phase of the first higher-order mode can be reduced to about −20° or less. Accordingly, as illustrated in FIG. 8, the decrease in attenuation in the filter unit can be reduced to about 10 dB or less.

SiN [λ], SiO2 [λ], LT [λ], and LTθ [deg.] are preferably thicknesses and an angle in ranges in which the phase of the first higher-order mode as derived from equation 1 is about −73° or less. In this case, as illustrated in FIG. 8, the decrease in attenuation in the filter unit can be reduced to about 2 dB or less. Thus, the attenuation characteristics of the filter unit can be further improved.

Although there is no particular lower limit on the phase of the first higher-order mode, the lower limit may preferably be, for example, about −90°. The phase of the first higher-order mode may be about −90° or more, or may be more than about −90°.

Example design parameters of an acoustic wave device according to a preferred embodiment of the present invention have been presented above. Other example design parameters are presented below.

Silicon substrate 2: material . . . single-crystal Si; plane orientation . . . (111); Euler angles . . . (−45 [deg.], −54.7 [deg.], 73 [deg.])

Silicon nitride layer 3: material . . . SiN; thickness SiN [λ] . . . about 50 nm Silicon oxide layer 4: material . . . SiO$_2$; thickness SiO$_2$ [λ] . . . about 400 nm Lithium tantalate layer 5: material . . . 35Y—LiTaO$_3$; thickness LT [λ] . . . about 300 nm; Euler angle LTθ [deg.] . . . about 125° The following design parameters may also be used.

Silicon substrate 2: material . . . single-crystal Si; plane orientation . . . (111); Euler angles . . . (about −45°, about −54.7°, about) 30°

Silicon nitride layer 3: material . . . SiN; thickness SiN [λ] . . . about 250 nm Silicon oxide layer 4: material . . . SiO$_2$; thickness SiO$_2$ [λ] . . . about 150 nm Lithium tantalate layer 5: material . . . 30Y—LiTaO$_3$; thickness LT [λ] . . . about 300 nm; Euler angle LTθ [deg.] . . . about 120°

Alternatively, the following design parameters may be used.

Silicon substrate 2: material . . . single-crystal Si; plane orientation . . . (111); Euler angles . . . (about −45°, about −54.7°, about) 60°

Silicon nitride layer 3: material . . . SiN; thickness SiN [λ] . . . about 650 nm Silicon oxide layer 4: material . . . SiO$_2$; thickness SiO$_2$ [λ] . . . about 300 nm Lithium tantalate layer 5: material . . . 35Y—LiTaO$_3$; thickness LT [λ] . . . about 300 nm; Euler angle LTθ [deg.] . . . about 125°

The wavelength λ of the IDT electrode 6 is preferably from about 1.3 μm to about 1.6 μm, for example. The thickness of the IDT electrode 6 is preferably from about 100 nm to about 140 nm, for example. The duty ratio of the IDT electrode 6 is preferably from about 0.3 to about 0.6, for example. The IDT electrode 6 may be, for example, an Al—Cu electrode.

Here, as indicated by the arrow B in FIG. 5, it is demonstrated that, in addition to the first higher-order mode, the second higher-order mode at a frequency of about 1.5 times the resonant frequency is effectively reduced or prevented in the first preferred embodiment. As indicated by the arrow A, the Rayleigh wave is also effectively reduced or prevented. The advantageous effect of reducing or preventing the second higher-order mode will first be described in detail, and the advantageous effect of reducing or preventing the Rayleigh wave will then be described in detail.

The phase of the second higher-order mode was measured with the design parameters of the acoustic wave device being varied in the same ranges as in the derivation of equation 1 above. Equation 2, which is an equation representing the relationship between the phase of the second higher-order mode and the various parameters, was derived from the results.

In addition to the configuration of 1) and 2) above, the acoustic wave device 1 according to the present preferred embodiment has the following configuration: 3-1) about 0°≤Siψ [deg.]≤about 30'; 4-1) LT [λ] about 0.179λ; and 5-1) SiN [λ], SiO$_2$ [λ], LT [λ], LTθ [deg.], and Siψ [deg.] are thicknesses and angles in ranges in which the phase of the second higher-order mode is about −70° or less as derived from equation 2 below. This enables the second higher-order mode to be reduced or prevented in addition to the first higher-order mode.

$$\begin{aligned}\text{phase[deg.]} = &(-205.883644685925) + \\
&127.798701342823\times(\text{``}LT[\lambda]\text{''}) + \\
&2.15277969099328\times(\text{``}LT\theta[\text{deg.}]\text{''}) - \\
&102.612816079968\times(\text{``}SiO_2[\lambda]\text{''}) - \\
&0.224847505825644\times(\text{``}Si\psi[\text{deg.}]\text{''}) - \\
&51.4047137303909\times(\text{``}SiN[\lambda]\text{''}) - \\
&0.00890818181751331\times(\text{``}LT\theta[\text{deg.}]\text{''})^2 + \\
&307.622195727849\times(\text{``}SiO_2[\lambda]\text{''})^2 - \\
&0.00758239200722899\times(\text{``}Si\psi[\text{deg.}]\text{''})^2 + \\
&77.4266396390485\times(\text{``}SiN[\lambda]\text{''})^2 - \\
&181.250917094982\times(\text{``}LT[\lambda]\text{''})\times(\text{``}SiN[\lambda]\text{''}) + \\
&1.30355347496229\times(\text{``}Si\psi[\text{deg.}]\text{''})\times(\text{``}SiN[\lambda]\text{''})\end{aligned}$$ equation 2

The phase of the second higher-order mode at a frequency of about 1.5 times the resonant frequency was measured with the SiN [λ], SiO$_2$ [λ], LT [λ], LTθ [deg.] and Siψ [deg.] of the acoustic wave device being varied. The attenuation-frequency characteristics of the filter unit including the acoustic wave device under the conditions where the phase was measured were measured. The decrease in attenuation due to the second higher-order mode at a frequency of about 1.5 times the resonant frequency was calculated with respect to simulation data in a case where no second higher-order mode occurred.

Figure 9:
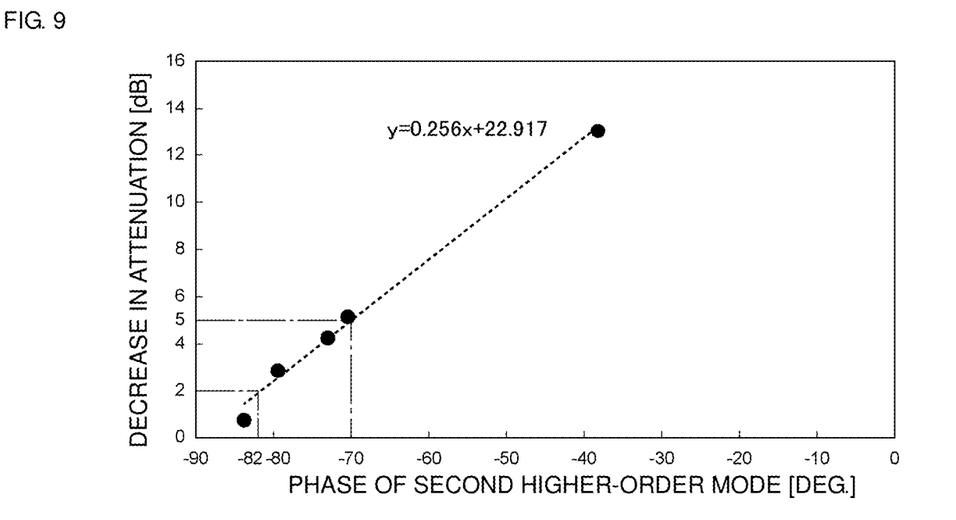
FIG. 9 is a graph illustrating the relationship between the phase of a second higher-order mode and the decrease in attenuation in the filter unit.

FIG. 9 is a graph illustrating the relationship between the phase of the second higher-order mode and the decrease in attenuation in the filter unit.

As illustrated in FIG. 9, it is demonstrated that there is a proportional relationship between the phase of the second higher-order mode in the acoustic wave device and the decrease in attenuation in the filter unit. Specifically, the above proportional relationship is expressed as y=0.256x+22.917, where y is the decrease in attenuation, and x is the phase of the second higher-order mode. In the first preferred embodiment, the phase of the second higher-order mode can be reduced or prevented to about −70° or less. Accordingly, as illustrated in FIG. 9, the decrease in attenuation in the filter unit can be reduced or prevented to about 5 [dB] or less.

SiN [λ], SiO$_2$ [λ], LT [λ], LTθ [deg.], and Siψ [deg.] are preferably thicknesses and angles in ranges in which the phase of the second higher-order mode as derived from equation 2 is about −82° or less. In this case, as illustrated in FIG. 9, the decrease in attenuation in the filter unit can be reduced to about 2 dB or less. Thus, the attenuation characteristics of the filter unit can be further improved.

Although there is no particular lower limit on the phase of the second higher-order mode, the lower limit may preferably be, for example, about −90°. The phase of the second higher-order mode may be about −90° or more, or may be more than about −90°.

In addition, equations 3 to 5, which are equations representing the relationship between the phase of the second higher-order mode and the various parameters, were derived in the same or substantially the same manner as equation 2. Instead of the configuration of 3-1), 4-1), and 5-1) above, the acoustic wave device may have the configuration of 3-2), 4-2), and 5-2), the configuration of 3-3), 4-3), and 5-3), or the configuration of 3-4), 4-4), and 5-4) below.

3-2) about 30°<Siψ [deg.]≤about 60°. 4-2) LT [λ]≤about 0.179λ. 5-2) SiO$_2$ [λ], LT [λ], and Siψ [deg.] are thicknesses and an angle in ranges in which the phase of the second higher-order mode is about −70° or less as derived from equation 3 below.

$$\begin{aligned}\text{phase[deg.]}=&(-95.094880212045)+\\&101.711189386615\times(\text{``}LT[\lambda]\text{''})+\\&128.75225217158\times(\text{``}SiO_2[\lambda]\text{''})-\\&0.0470853398232617\times(\text{``}Si\psi[\text{deg.}]\text{''})-\\&3206.16069403422\times(\text{``}SiO_2[\lambda]\text{''})^2+\\&17936.7194110188\times(\text{``}SiO_2[\lambda]\text{''})^3-\\&29992.9686614269\times(\text{``}SiO_2[\lambda]\text{''})^4+\\&0.906373829580059\times(\text{``}SiO_2[\lambda]\text{''})\times(\text{``}Si\psi[\text{deg.}]\text{''})\end{aligned}$$ equation 3

In this case, the second higher-order mode can be reduced or prevented. SiO$_2$ [λ], LT [λ], and Siψ [deg.] are preferably thicknesses and an angle in ranges in which the phase of the second higher-order mode as derived from equation 3 is about −82° or less. In this case, the second higher-order mode can be further reduced or prevented. Thus, when the acoustic wave device is used in a filter unit, the attenuation characteristics can be further improved.

3-3) about 0°≤Siψ [deg.]≤about 30°. 4-3) LT [λ]>about 0.179λ. 5-3) SiN [λ], SiO$_2$ [λ], LT [λ], LTθ [deg.], and Siψ [deg.] are thicknesses and angles in ranges in which the phase of the second higher-order mode is about −70° or less as derived from equation 4 below.

$$\begin{aligned}\text{phase[deg.]}=&(-392.892314841977)+\\&89.8044648175736\times(\text{``}LT[\lambda]\text{''})+\\&4.83528870777243\times(\text{``}LT\theta[\text{deg.}]\text{''})+\\&42.3707695093921\times(\text{``}SiO_2[\lambda]\text{''})+\\&1.3908306540313\times(\text{``}Si\psi[\text{deg.}]\text{''})-\\&67.6290880097491\times(\text{``}SiN[\lambda]\text{''})-\\&0.0172601858992679\times(\text{``}LT\theta[\text{deg.}]\text{''})^2+\\&805.019716677561\times(\text{``}SiO_2[\lambda]\text{''})^2-\\&0.0159531563567603\times(\text{``}Si\psi[\text{deg.}]\text{''})^2+\\&85.4536492286811\times(\text{``}SiN[\lambda]\text{''})^2-\\&2.20006335400308\times(\text{``}LT\theta[\text{deg.}]\text{''})\times(\text{``}SiO_2[\lambda]\text{''})-\\&0.0128636179659422\times(\text{``}LT\theta[\text{deg.}]\text{''})\times(\text{``}Si\psi[\text{deg.}]\text{''})-133.229375274161\times(\text{``}SiO_2[\lambda]\text{''})\times(\text{``}SiN[\lambda]\text{''})+1.5036945578866\times(\text{``}Si\psi[\text{deg.}]\text{''})\times(\text{``}SiN[\lambda]\text{''})\end{aligned}$$ equation 4

In this case, the second higher-order mode can be reduced or prevented. SiN [λ], SiO$_2$ [λ], LT [λ], LTθ [deg.], and Siψ [deg.] are preferably thicknesses and angles in ranges in which the phase of the second higher-order mode as derived from equation 4 is about −82° or less. In this case, the second higher-order mode can be further reduced or prevented. Thus, when the acoustic wave device is used in a filter unit, the attenuation characteristics can be further improved.

3-4) The IDT electrode 6 is an aluminum electrode, and about 30°<Siψ[deg.]≤about 60°. 4-4) LT [λ]>about 0.179λ. 5-4) Al [λ], SiN [λ], SiO$_2$ [λ], LT [λ], LTθ [deg.], and Siψ [deg.] are thicknesses and angles in ranges in which the phase of the second higher-order mode is about −70° or less as derived from equation 5 below.

$$\begin{aligned}\text{phase[deg.]}=&(-399.83489386091)+\\&1237.69111458529\times(\text{``}Al[\lambda]\text{''})+\\&110.765597748741\times(\text{``}LT[\lambda]\text{''})+\\&4.70911344378166\times(\text{``}LT\theta[\text{deg.}]\text{''})-\\&538.290200050676\times(\text{``}SiO_2[\lambda]\text{''})+\\&0.159441787289077\times(\text{``}Si\psi[\text{deg.}]\text{''})-\\&11.3589769001844\times(\text{``}SiN[\lambda]\text{''})-\\&0.0176171588883711\times(\text{``}LT\theta[\text{deg.}]\text{''})^2+\\&3583.79682941935\times(\text{``}SiO_2[\lambda]\text{''})^2-\\&5766.3194876186\times(\text{``}SiO_2[\lambda]\text{''})^3-\\&8.32276363625543\times(\text{``}Al[\lambda]\text{''})\times(\text{``}LT\theta[\text{deg.}]\text{''})-\\&1532.20321265641\times(\text{``}Al[\lambda]\text{''})\times(\text{``}SiO_2[\lambda]\text{''})+\\&89.1277241924082\times(\text{``}SiO_2[\lambda]\text{''})\times(\text{``}SiN[\lambda]\text{''})\end{aligned}$$ equation 5

In this case, the second higher-order mode can be reduced or prevented. Al [λ], SiN [λ], SiO$_2$ [λ], LT [λ], LTθ [deg.], and Siψ [deg.] are preferably thicknesses and angles in ranges in which the phase of the second higher-order mode as derived from equation 5 is about −82° or less. In this case, the second higher-order mode can be further reduced or prevented. Thus, when the acoustic wave device is used in a filter unit, the attenuation characteristics can be further improved.

In the first preferred embodiment, the first higher-order mode and the second higher-order mode can be reduced or prevented, and the Rayleigh wave can also be reduced or prevented. The advantageous effects of reducing or preventing the Rayleigh wave will hereinafter be described in detail.

The phase of the Rayleigh wave was measured with the design parameters of the acoustic wave device being varied in the same ranges as in the derivation of equation 1 above. Equation 6, which is an equation representing the relationship between the phase of the Rayleigh wave and the various parameters, was derived from the results.

In addition to the configuration of 1), 2), 3-1), 4-1), and 5-1) above, the acoustic wave device 1 according to the present preferred embodiment has the following configuration: 6) the IDT electrode 6 is an aluminum electrode; and 7) Al [λ], SiN [λ], SiO$_2$ [λ], LT [λ], LTθ [deg.], and Siψ [deg.] are thicknesses and angles in ranges in which the phase of the Rayleigh wave is about −72° or less as derived from equation 6 below. This enables the Rayleigh wave to be reduced or prevented in addition to the first higher-order mode and the second higher-order mode.

$$\begin{aligned}\text{phase[deg.]}=&(-33248.0843066889)-\\&2022.07522889033\times(\text{``}Al[\lambda]\text{''})+\\&402.370929355681\times(\text{``}LT[\lambda]\text{''})+\\&1127.75197369894\times(\text{``}LT\theta[\text{deg.}]\text{''})+\\&413.75228258329\times(\text{``}SiO_2[\lambda]\text{''})-\\&0.787669638019358\times(\text{``}Si\psi[\text{deg.}]\text{''})-\\&12.1242670011703\times(\text{``}SiN[\lambda]\text{''})-\\&14.2127713812958\times(\text{``}LT\theta[\text{deg.}]\text{''})^2+\\&0.0787858396593867\times(\text{``}LT\theta[\text{deg.}]\text{''})^3-\\&0.000162271010336368\times(\text{``}LT\theta[\text{deg.}]\text{''})^4+\\&16.0480592141443\times(\text{``}Al[\lambda]\text{''})\times(\text{``}LT\theta[\text{deg.}]\text{''})-\\&2.8737040817671\times(\text{``}LT[\lambda]\text{''})\times(\text{``}LT\theta[\text{deg.}]\text{''})-\\&3.29244406546554\times(\text{``}LT\theta[\text{deg.}]\text{''})\times(\text{``}SiO_2[\lambda]\text{''})+\\&0.00614278417047359\times\text{``}LT\theta[\text{deg.}]\text{''})\times(\text{``}Si\psi[\text{deg.}]\text{''})\end{aligned}$$ equation 6

The acoustic wave device 1 according to the first preferred embodiment need not have the configuration of 3-1), 4-1), and 5-1), the configuration of 3-2), 4-2), and 5-2), the configuration of 3-3), 4-3), and 5-3), or the configuration of 3-4), 4-4), and 5-4) above. The acoustic wave device 1 may have the configuration of 1), 2), 6), and 7) above. Alternatively, it is sufficient that the acoustic wave device 1 have at least the configuration of 1) and 2) above.

Figure 10:
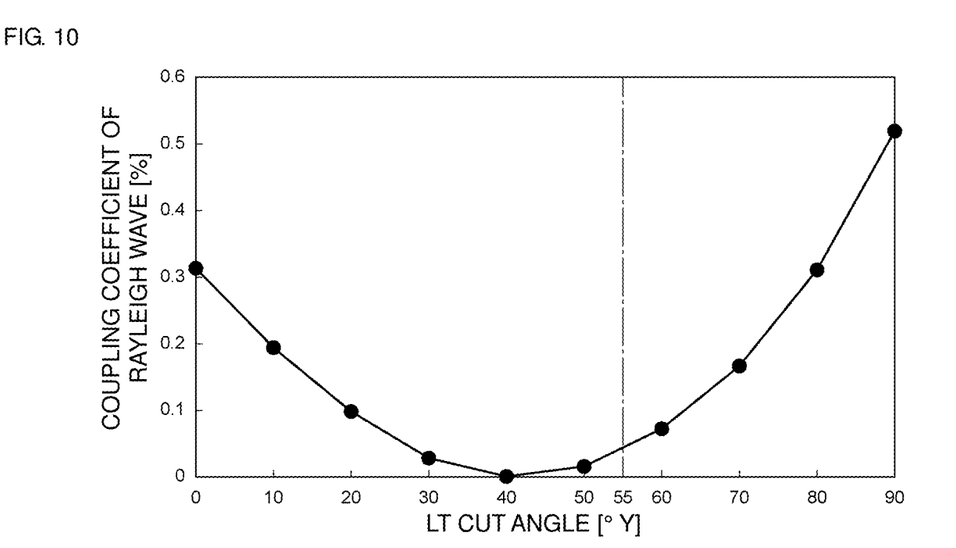
FIG. 10 is a graph illustrating the relationship between the LT cut angle and the coupling coefficient of a Rayleigh wave.
Figure 11:
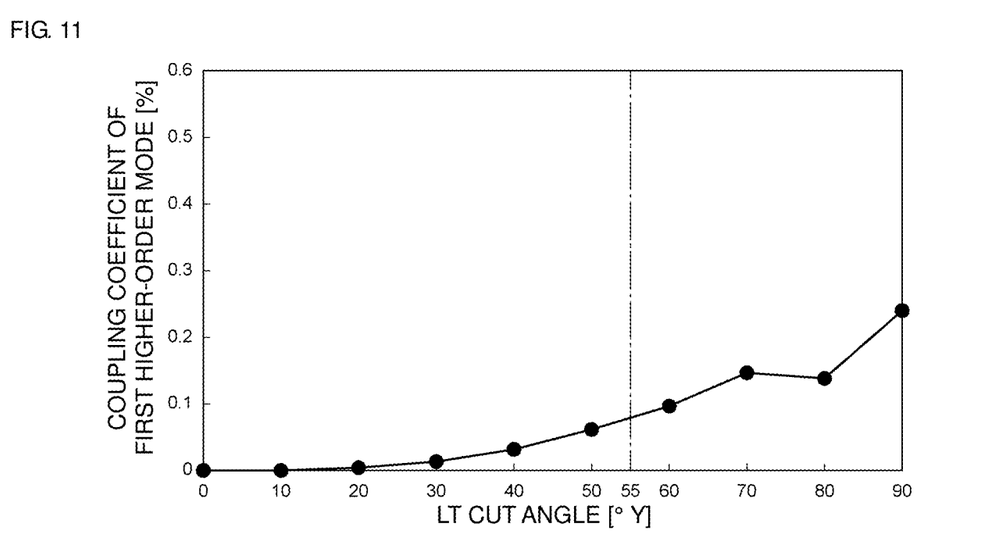
FIG. 11 is a graph illustrating the relationship between the LT cut angle and the coupling coefficient of the first higher-order mode.

The Rayleigh wave can be reduced or prevented by setting the cut angle of the lithium tantalate layer 5 to an appropriate value. However, it is difficult to sufficiently suppress the first higher-order mode simply by setting the cut angle at which the Rayleigh wave can be reduced or prevented. An example of this is illustrated in FIGS. 10 and 11. In the configuration of the first preferred embodiment, the cut angle of the lithium tantalate layer 5 is expressed as {(LTθ−180)+90} [°Y]=(LTθ−90) [° Y] based on crystal equivalence. The cut angle of the lithium tantalate layer 5 may hereinafter be referred to as "LT cut angle [° Y]", or "LT cut angle", with the unit omitted.

FIG. 10 is a graph illustrating the relationship between the LT cut angle and the coupling coefficient of the Rayleigh wave. FIG. 11 is a graph illustrating the relationship between the LT cut angle and the coupling coefficient of the first higher-order mode.

In the related art, the LT cut angle may be set to, for example, about 55° Y. In this case, as illustrated in FIGS. 10 and 11, the coupling coefficients of the Rayleigh wave and the first higher-order mode cannot both be sufficiently reduced. Here, in the example illustrated in FIG. 10, the coupling coefficient of the Rayleigh wave can be reduced to 0 when the LT cut angle of the lithium tantalate layer 5 is about 40° Y. However, as illustrated in FIG. 11, the coupling coefficient of the first higher-order mode cannot be reduced to 0 when the LT cut angle is about 40° Y.

In contrast, the first preferred embodiment has a configuration in which the LT cut angle [° Y], i.e., LTθ [deg.], is adjusted, and additionally, for example, the values of LT [λ] and $SiO_2$ [λ] are also reduced. More specifically, the acoustic wave device 1 satisfies the conditions where the phase of the first higher-order mode as derived from equation 1 is about −20° or less, and also satisfies the conditions where the phase of the Rayleigh wave as derived from equation 6 is about −72° or less. This enables the Rayleigh wave to be reduced or prevented in addition to the first higher-order mode.

The phase of the Rayleigh wave at a frequency of about 0.7 times the resonant frequency was measured with the Al [λ], SiN [λ], $SiO_2$ [λ], LT [λ], LTθ [deg.], and Siψ [deg.] of the acoustic wave device being varied. The attenuation-frequency characteristics of the filter unit including the acoustic wave device under the conditions where the phase was measured were measured. The decrease in attenuation due to the Rayleigh wave at a frequency of about 0.7 times the resonant frequency was calculated with respect to simulation data in a case where no Rayleigh wave occurred.

Figure 12:
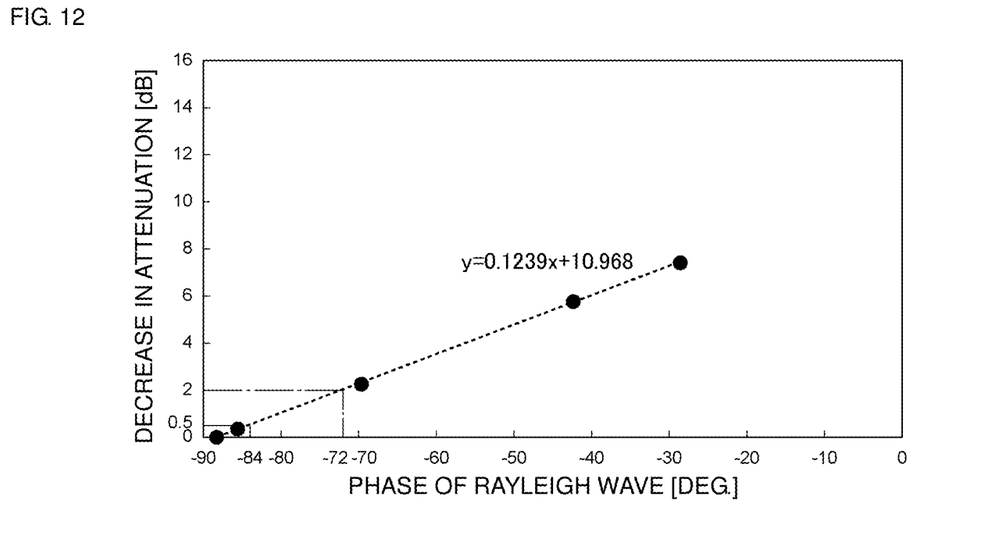
FIG. 12 is a graph illustrating the relationship between the phase of the Rayleigh wave and the decrease in attenuation in the filter unit.

FIG. 12 is a graph illustrating the relationship between the phase of the Rayleigh wave and the decrease in attenuation in the filter unit.

As illustrated in FIG. 12, it is demonstrated that there is a proportional relationship between the phase of the Rayleigh wave in the acoustic wave device and the decrease in attenuation in the filter unit. Specifically, the above proportional relationship is expressed as y=0.1239x+10.968, where y is the decrease in attenuation, and x is the phase of the Rayleigh wave. In the first preferred embodiment, the phase of the Rayleigh wave can be reduced or prevented to about −72 [deg.] or less. Accordingly, as illustrated in FIG. 12, the decrease in attenuation in the filter unit can be reduced or prevented to about 2 [dB] or less.

Al [λ], SiN [λ], $SiO_2$ [λ], LT [λ], LTθ [deg.], and siψ [deg.] are preferably thicknesses and angles in ranges in which the phase of the Rayleigh wave as derived from equation 6 is about −84° or less. In this case, as illustrated in FIG. 12, the decrease in attenuation in the filter unit can be reduced or prevented to about 0.5 dB or less. Thus, the attenuation characteristics of the filter unit can be further improved.

Although there is no particular lower limit on the phase of the Rayleigh wave, the lower limit may preferably be, for example, about −90°. The phase of the Rayleigh wave may be about −90° or more, or may be more than about −90°.

The acoustic wave device 1 satisfies the conditions where the phase derived from equation 1 is about −20° or less, the conditions where the phase derived from equation 2 is about −70° or less, and the conditions where the phase derived from equation 6 is about −72° or less. More specifically, the Al [λ], SiN [λ], $SiO_2$ [λ], LT [λ], LTθ [deg.], and Siψ [deg.] of the acoustic wave device 1 are thicknesses and angles in ranges in which the above conditions are satisfied. Thus, for example, even if LTθ is varied, other thicknesses and angles can be adjusted to reduce or prevent the first higher-order mode, the second higher-order mode, and the Rayleigh wave. An example of this is presented below.

The phases of the Rayleigh wave, the first higher-order mode, and the second higher-order mode were measured with the LT cut angle, i.e., LTθ, of the acoustic wave device 1 having the configuration of the first preferred embodiment being varied. The design parameters of the acoustic wave device 1 are as follows.

Silicon substrate 2: material . . . single-crystal Si; plane orientation . . . (111); Euler angles . . . (−45 [deg.], −54.7 [deg.], 30 [deg.])

Figure 13:
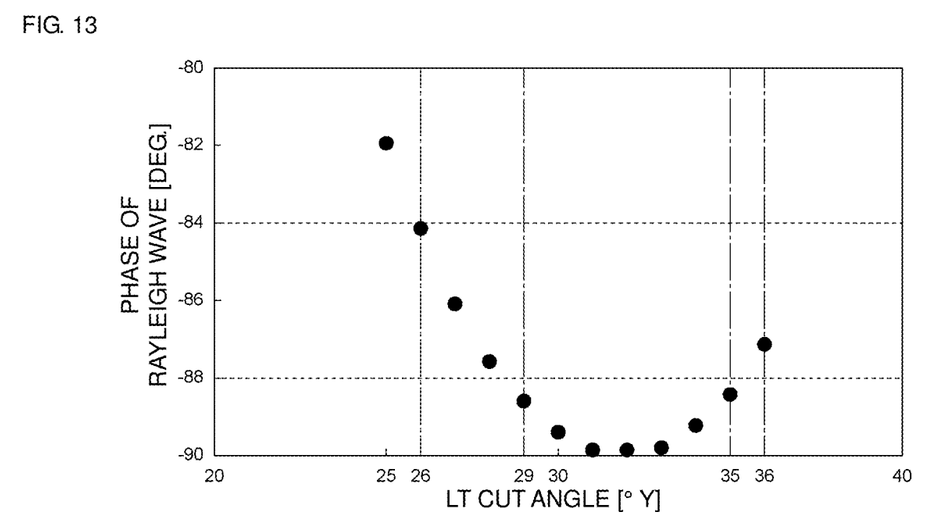
FIG. 13 is a graph illustrating the relationship between the LT cut angle and the phase of the Rayleigh wave.
Figure 14:
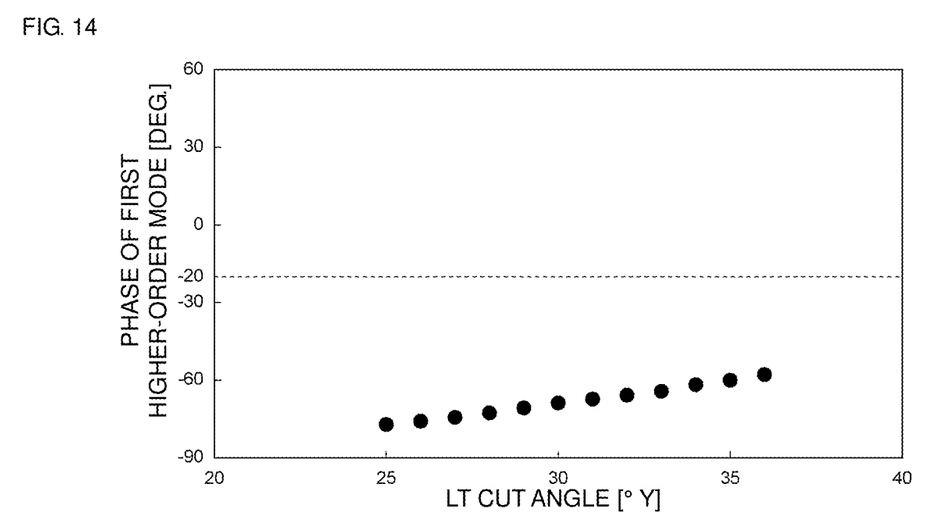
FIG. 14 is a graph illustrating the relationship between the LT cut angle and the phase of the first higher-order mode.
Figure 15:
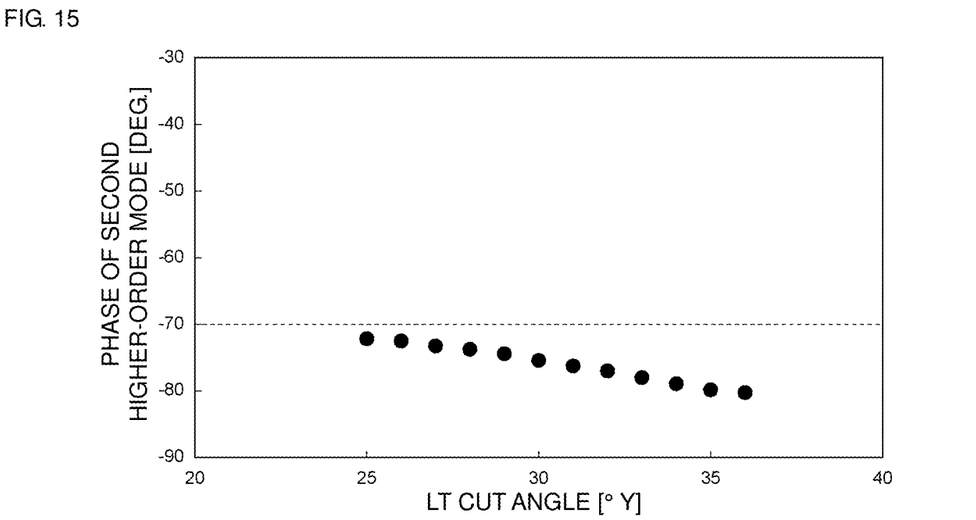
FIG. 15 is a graph illustrating the relationship between the LT cut angle and the phase of the second higher-order mode.

Silicon nitride layer 3: material . . . SiN; thickness SiN [λ] . . . about 50 nm Silicon oxide layer 4: material . . . $SiO_2$; thickness $SiO_2$ [λ] . . . about 400 nm Lithium tantalate layer 5: material . . . $LiTaO_3$; thickness LT [λ] . . . about 300 nm; LT cut angle [° Y] . . . varied in a range from about 25° Y to about 36° Y in units of 1° Y IDT electrode 6: material . . . Al; thickness . . . about 140 nm; wavelength . . . about 1.4 μm FIG. 13 is a graph illustrating the relationship between the LT cut angle and the phase of the Rayleigh wave. FIG. 14 is a graph illustrating the relationship between the LT cut angle and the phase of the first higher-order mode. FIG. 15 is a graph illustrating the relationship between the LT cut angle and the phase of the second higher-order mode.

As illustrated in FIG. 13, in the range of LT cut angle from about 25° Y to about 36° Y, the phase of the Rayleigh wave is less than about −72°. On the other hand, as illustrated in FIGS. 14 and 15, in the range of LT cut angle from about 25° Y to about 36° Y, the phase of the first higher-order mode is less than about −20°, and the phase of the second higher-order mode is less than about −70°. In this way, by using the above design parameters, the first higher-order mode, the second higher-order mode, and the Rayleigh wave can be sufficiently reduced or prevented in the range of LT cut angle from about 25° Y to about 36° Y. Thus, it is demonstrated that, even if the LT cut angle, i.e., LTO, is varied, other thicknesses and angles can be adjusted to sufficiently reduce or prevent the first higher-order mode, the second higher-order mode, and the Rayleigh wave.

In addition, as illustrated in FIG. 13, in the range of LT cut angle from about 26° Y to about 36° Y, the phase of the Rayleigh wave can be reduced to less than about −84°. In the range of LT cut angle from about 29° Y to about 35° Y, the phase of the Rayleigh wave can be reduced to less than about −88°.

Figure 16:
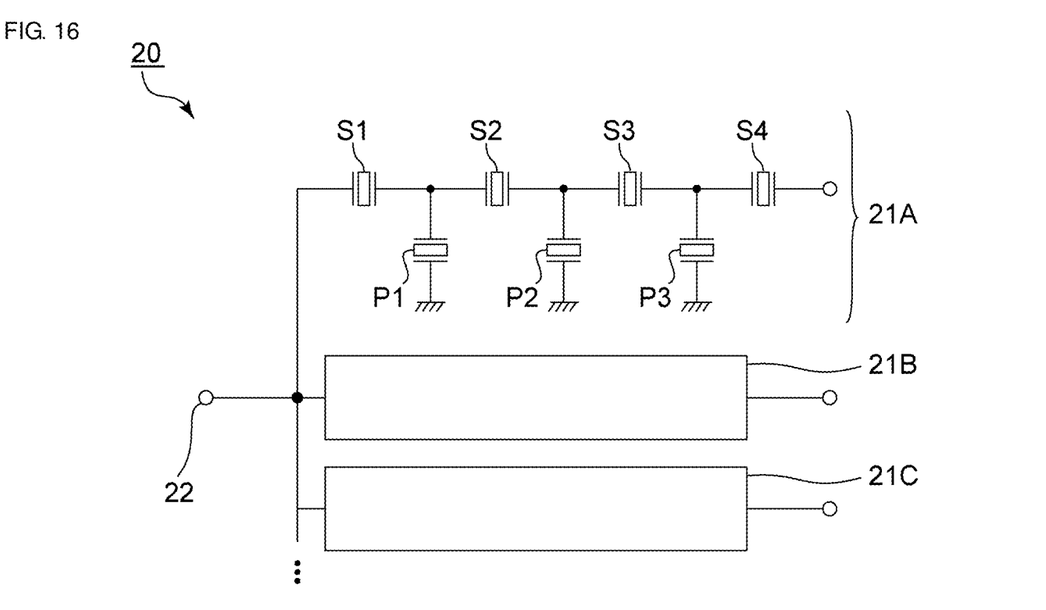
FIG. 16 is a schematic circuit diagram of a composite filter apparatus according to a second preferred embodiment of the present invention.

FIG. 16 is a schematic circuit diagram of a composite filter apparatus according to a second preferred embodiment of the present invention.

The composite filter apparatus 20 is a multiplexer, for example. More specifically, the composite filter apparatus 20 includes a common connection terminal 22, a first filter unit 21A, a second filter unit 21B, and a third filter unit 21C. The first filter unit 21A includes an acoustic wave device according to a preferred embodiment of the present invention. The first filter unit 21A, the second filter unit 21B, and the third filter unit 21C are connected in common to the common connection terminal 22. The common connection terminal 22 is connected to, for example, an antenna. The common connection terminal 22 may be configured as an electrode pad or may be configured as a wiring line.

The first filter unit 21A has a first pass band. The second filter unit 21B has a second pass band. The third filter unit 21C has a third pass band. The first pass band, the second pass band, and the third pass band are different from each other. The first filter unit 21A, the second filter unit 21B, and the third filter unit 21C may each be a transmission filter or a reception filter.

The composite filter apparatus 20 includes a plurality of filter units in addition to the first filter unit 21A, the second filter unit 21B, and the third filter unit 21C. However, the composite filter apparatus 20 may include any number of filter units. The composite filter apparatus 20 may include only the first filter unit 21A and the second filter unit 21B. In this case, the composite filter apparatus 20 is, for example, a duplexer.

As illustrated in FIG. 16, the first filter unit 21A in the present preferred embodiment is a ladder filter. The first filter unit 21A includes a series arm resonator S1, a series arm resonator S2, a series arm resonator S3, a series arm resonator S4, a parallel arm resonator P1, a parallel arm resonator P2, and a parallel arm resonator P3. The series arm resonator Si, the series arm resonator S2, the series arm resonator S3, and the series arm resonator S4 are connected in series to each other. The parallel arm resonator P1 is connected between a node between the series arm resonators S1 and S2 and a ground potential. The parallel arm resonator P2 is connected between a node between the series arm resonators S2 and S3 and a ground potential. The parallel arm resonator P3 is connected between a node between the series arm resonators S3 and S4 and a ground potential. The resonator located closest to the common connection terminal 22 is the series arm resonator S1.

The series arm resonator S1 is an acoustic wave device according to a preferred embodiment of the present invention. However, any resonator other than the series arm resonator S1 in the first filter unit 21A may be an acoustic wave device according to a preferred embodiment of the present invention. It is sufficient that the first filter unit 21A include at least one acoustic wave device according to a preferred embodiment of the present invention. The circuit configuration of the first filter unit 21A is not limited to the above.

On the other hand, the second filter unit 21B and the third filter unit 21C may have any circuit configuration.

In the series arm resonator S1, a first higher-order mode is excited at a frequency of from about 2.0 times to about 2.5 times the resonant frequency. In addition, a second higher-order mode is excited at a frequency of from about 1.2 times to about 1.7 times the resonant frequency, and a Rayleigh wave is excited at a frequency lower than the resonant frequency. As in the first preferred embodiment, the first higher-order mode is reduced or prevented. On the other hand, the phase of the second higher-order mode is more than about −72°. The phase of the Rayleigh wave is more than about −70.

Here, in the present preferred embodiment, the frequency that is about 1.5 times the resonant frequency of the series arm resonator S1 and the frequency of the Rayleigh wave are located outside the second pass band. Thus, the influences of the second higher-order mode and the Rayleigh wave that occur in the first filter unit 21A on the second filter unit 21B can be reduced or prevented. Because the first higher-order mode is reduced or prevented in the first filter unit 21A, the influence of the first higher-order mode on the second filter unit 21B can also be reduced or prevented. More specifically, for example, an increase in insertion loss in the second filter unit 21B can be reduced or prevented.

It is sufficient that at least one of the frequency that is about 1.5 times the resonant frequency of the series arm resonator S1 and the frequency of the Rayleigh wave is located outside the second pass band. If the frequency of the Rayleigh wave in the series arm resonator S1 is located outside the second pass band, it is preferable to satisfy the conditions where the second higher-order mode is reduced or prevented. More specifically, the series arm resonator S1 preferably has the configuration of 3-1), 4-1), and 5-1), the configuration of 3-2), 4-2), and 5-2), the configuration of 3-3), 4-3), and 5-3), or the configuration of 3-4), 4-4), and 5-4) above. Alternatively, if the frequency that is about 1.5 times the resonant frequency of the series arm resonator S1 is located outside the second pass band, it is preferable to satisfy the conditions where the Rayleigh wave is reduced or prevented. More specifically, the series arm resonator S1 preferably has the configuration of 6) and 7) above. In these cases, the influence of the first higher-order mode, the second higher-order mode, and the Rayleigh wave on the second filter unit 21B can be reduced or prevented.

Here, the Rayleigh wave occurs at a frequency lower than the resonant frequency. Thus, the configuration in which the Rayleigh wave is located outside the second pass band is preferable when the second pass band is a frequency band lower than the first pass band. On the other hand, the configuration in which the second higher-order mode is located outside the second pass band is preferable when the second pass band is a frequency band higher than the first pass band.

The configuration of the present preferred embodiment is particularly preferable when the second higher-order mode or the Rayleigh wave is not sufficiently reduced or prevented. In the configuration of the present preferred embodiment, the phase of the second higher-order mode may be about −72° or less. Similarly, the phase of the Rayleigh wave may be about −70° or less.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a (111)-oriented silicon substrate;
a silicon nitride layer on the silicon substrate;
a silicon oxide layer on the silicon nitride layer;
a lithium tantalate layer on the silicon oxide layer; and
an interdigital transducer (IDT) electrode on the lithium tantalate layer; wherein
the acoustic wave device has a resonant frequency; and
when a wavelength determined by an electrode finger pitch of the IDT electrode is $\lambda$, a thickness of the silicon nitride layer is SiN [$\lambda$], a thickness of the silicon oxide layer is SiO$_2$ [$\lambda$], a thickness of the lithium tantalate layer is LT [λ], and Euler angles of the lithium tantalate layer are (LTφ [deg.], LTθ [deg.], LTψ [deg.]), SiN [λ], SiO$_2$ [λ], LT [λ], and LTθ [deg.] are thicknesses and an angle in ranges in which a phase of a first higher-order mode is about −20° or less as derived from equation 1:

$$\begin{aligned}\text{phase[deg.]}=&6047.63520371535-3073.77179344486\times\\&(\text{``}LT[\lambda]\text{''})-150.043164693716\times(\text{``}LT\theta[\text{deg.}]\text{''})+\\&85.8474275079871\times\text{``}\text{SiO}_2[\lambda]\text{''})+\\&122.520263077834\times(\text{``}\text{SiN}[\lambda]\text{''})+\\&13410.0503377046\times(\text{``}LT[\lambda]\text{''})^2-\\&22919.3322354524\times(\text{``}LT[\lambda]\text{''})^3+\\&1.23679341913702\times(\text{``}LT\theta[\text{deg.}]\text{''})^2-\\&0.00339999845069541\times(\text{``}LT\theta[\text{deg.}]\text{''})^3+\\&8.82482069182538\times(\text{``}LT[\lambda]\text{''})\times(\text{``}LT\theta[\text{deg.}]\text{''})-\\&693.691058668391\times(\text{``}LT[\lambda]\text{''})\times(\text{``}\text{SiN}[\lambda]\text{''})\end{aligned}$$ equation 1.

2. The acoustic wave device according to claim 1, wherein SiN [λ], SiO$_2$ [λ], LT [λ], and LTθ [deg.] are thicknesses and an angle in ranges in which the phase of the first higher-order mode as derived from equation 1 is about −73° or less.

3. The acoustic wave device according to claim 1, wherein when Euler angles of the silicon substrate are (about −45°, about −54.7°, Siψ [deg.]), about 0°≤Siψ [deg.]≤about 30°, LT [λ]≤about 0.179λ; and SiN [λ], SiO$_2$ [λ], LT [λ], LTθ [deg.], and Siψ [deg.] are thicknesses and angles in ranges in which a phase of a second higher-order mode is about −70° or less as derived from equation 2:

$$\begin{aligned}\text{phase[deg.]}=&(-205.883644685925)+\\&127.798701342823\times(\text{``}LT[\lambda]\text{''})+\\&2.15277969099328\times(\text{``}LT\theta[\text{deg.}]\text{''})-\\&102.612816079968\times(\text{``}\text{SiO}_2[\lambda]\text{''})-\\&0.224847505825644\times(\text{``}\text{Si}\psi[\text{deg.}]\text{''})-\\&51.4047137303909\times(\text{``}\text{SiN}[\lambda]\text{''})-\\&0.00890818181751331\times(\text{``}LT\theta[\text{deg.}]\text{''})^2+\\&307.622195727849\times(\text{``}\text{SiO}_2[\lambda]\text{''})^2-\\&0.00758239200722899\times(\text{``}\text{Si}\psi[\text{deg.}]\text{''})^2+\\&77.4266396390485\times(\text{``}\text{SiN}[\lambda]\text{''})^2-\\&181.250917094982\times(\text{``}LT[\lambda]\text{''})\times(\text{``}\text{SiN}[\lambda]\text{''})+\\&1.30355347496229\times(\text{``}\text{Si}\psi[\text{deg.}]\text{''})\times(\text{``}\text{SiN}[\lambda]\text{''})\end{aligned}$$ equation 2.

4. The acoustic wave device according to claim 3, wherein SiN [λ], SiO$_2$ [λ], LT [λ], LTθ [deg.], and Siψ [deg.] are thicknesses and angles in ranges in which the phase of the second higher-order mode as derived from equation 2 is about −82° or less.

5. The acoustic wave device according to claim 1, wherein when Euler angles of the silicon substrate are (about −45°, about −54.7°, Siψ [deg.]), about 30°<Siψ [deg.]≤about 60°, LT [λ]≤about 0.179λ; and SiO$_2$ [λ], LT [λ], and Siψ [deg.] are thicknesses and an angle in ranges in which a phase of a second higher-order mode is about −70° or less as derived from equation 3:

$$\begin{aligned}\text{phase[deg.]}=&(-95.094880212045)+\\&101.711189386615\times(\text{``}LT[\lambda]\text{''})+\\&128.75225217158\times(\text{``}\text{SiO}_2[\lambda]\text{''})-\\&0.0470853398232617\times(\text{``}\text{Si}\psi[\text{deg.}]\text{''})-\\&3206.16069403422\times(\text{``}\text{SiO}_2[\lambda]\text{''})^2+\\&17936.7194110188\times(\text{``}\text{SiO}_2[\lambda]\text{''})^3-\\&29992.9686614269\times(\text{``}\text{SiO}_2[\lambda]\text{''})^4+\\&0.906373829580059\times(\text{``}\text{SiO}_2[\lambda]\text{''})\times(\text{``}\text{Si}\psi[\text{deg.}]\text{''})\end{aligned}$$ equation 3.

6. The acoustic wave device according to claim 5, wherein SiO$_2$ [λ], LT [λ], and Siψ [deg.] are thicknesses and an angle in ranges in which the phase of the second higher-order mode as derived from equation 3 is about −82°.

7. The acoustic wave device according to claim 1, wherein when Euler angles of the silicon substrate are (about −45°, about −54.7°, Siψ [deg.]), about 0°≤Siψ [deg.]≤about 30°, LT [λ]>about 0.179λ; and SiN [λ], SiO$_2$ [λ], LT [λ], LTθ [deg.], and Siψ [deg.] are thicknesses and angles in ranges in which a phase of a second higher-order mode is about −70° or less as derived from equation 4:

$$\begin{aligned}\text{phase[deg.]}=&(-392.892314841977)+\\&89.8044648175736\times(\text{``}LT[\lambda]\text{''})+\\&4.83528870777243\times(\text{``}LT\theta[\text{deg.}]\text{''})+\\&42.3707695093921\times(\text{``}\text{SiO}_2[\lambda]\text{''})+\\&1.3908306540313\times(\text{``}\text{Si}\psi[\text{deg.}]\text{''})-\\&67.6290880097491\times(\text{``}\text{SiN}[\lambda]\text{''})-\\&0.0172601858992679\times(\text{``}LT\theta[\text{deg.}]\text{''})^2+\\&805.019716677561\times(\text{``}\text{SiO}_2[\lambda]\text{''})^2-\\&0.0159531563567603\times(\text{``}\text{Si}\psi[\text{deg.}]\text{''})^2+\\&85.4536492286811\times(\text{``}\text{SiN}[\lambda]\text{''})^2-\\&2.20006335400308\times(\text{``}LT\theta[\text{deg.}]\text{''})\times(\text{``}\text{SiO}_2[\lambda]\text{''})-\\&0.0128636179659422\times(\text{``}LT\theta[\text{deg.}]\text{''})\times(\text{``}\text{Si}\psi\\&[\text{deg.}]\text{''})-133.229375274161\times(\text{``}\text{SiO}_2[\lambda]\text{''})\times(\text{``}\text{SiN}\\&[\lambda]\text{''})+1.5036945578866\times(\text{``}\text{Si}\psi[\text{deg.}]\text{''})\times(\text{``}\text{SiN}\\&[\lambda]\text{''})\end{aligned}$$ equation 4.

8. The acoustic wave device according to claim 7, wherein SiN [λ], SiO$_2$ [λ], LT [λ], LTθ [deg.], and Siψ [deg.] are thicknesses and angles in ranges in which the phase of the second higher-order mode as derived from equation 4 is about −82° or less.

9. The acoustic wave device according to claim 1, wherein the IDT electrode is an aluminum electrode;

when Euler angles of the silicon substrate are (about −45°, about −54.7°, Siψ [deg.]), about 30°<Siψ [deg.]≤about 60°, LT [λ]>about 0.179λ; and when a thickness of the IDT electrode is Al [λ], Al [λ], SiN [λ], SiO$_2$ [λ], LT [λ], LTθ [deg.], and Siψ [deg.] are thicknesses and angles in ranges in which a phase of a second higher-order mode is about −70° or less as derived from equation 5:

$$\begin{aligned}\text{phase[deg.]}=&(-399.83489386091)+\\&1237.69111458529\times(\text{``}\text{Al}[\lambda]\text{''})+\\&110.765597748741\times(\text{``}LT[\lambda]\text{''})+\\&4.70911344378166\times(\text{``}LT\theta[\text{deg.}]\text{''})-\\&538.290200050676\times(\text{``}\text{SiO}_2[\lambda]\text{''})+\\&0.159441787289077\times(\text{``}\text{Si}\psi[\text{deg.}]\text{''})-\\&11.3589769001844\times(\text{``}\text{SiN}[\lambda]\text{''})-\\&0.0176171588883711\times(\text{``}LT\theta[\text{deg.}]\text{''})^2+\\&3583.79682941935\times(\text{``}\text{SiO}_2[\lambda]\text{''})^2-\\&5766.3194876186\times(\text{``}\text{SiO}_2[\lambda]\text{''})^3-\\&8.32276363625543\times(\text{``}\text{Al}[\lambda]\text{''})\times(\text{``}LT\theta[\text{deg.}]\text{''})-\\&1532.20321265641\times(\text{``}\text{Al}[\lambda]\text{''})\times(\text{``}\text{SiO}_2[\lambda]\text{''})+\\&89.1277241924082\times(\text{``}\text{SiO}_2[\lambda]\text{''})\times(\text{``}\text{SiN}[\lambda]\text{''})\end{aligned}$$ equation 5.

10. The acoustic wave device according to claim 9, wherein Al [λ], SiN [λ], SiO$_2$ [λ], LT [λ], LTθ [deg.], and Siψ [deg.] are thicknesses and angles in ranges in which the phase of the second higher-order mode as derived from equation 5 is about −82° or less.

11. The acoustic wave device according to claim 1, wherein the IDT electrode is an aluminum electrode; and when Euler angles of the silicon substrate are (about −45°, about −54.7°, Siψ [deg.]) and a thickness of the IDT electrode is Al [λ], the thickness of the IDT electrode, SiN [λ], SiO$_2$ [λ], LT [λ], LTθ [deg.], and Siψ [deg.] are thicknesses and angles in ranges in which a phase of a Rayleigh wave is about −72° or less as derived from equation 6:

$$\begin{aligned}\text{phase[deg.]}=&(-33248.0843066889)-\\&2022.07522889033\times(\text{``}\text{Al}[\lambda]\text{''})+\\&402.370929355681\times(\text{``}LT[\lambda]\text{''})+\\&1127.75197369894\times(\text{``}LT\theta[\text{deg.}]\text{''})+\\&413.75228258329\times(\text{``}\text{SiO}_2[\lambda]\text{''})-\\&0.787669638019358\times(\text{``}\text{Si}\psi[\text{deg.}]\text{''})-\\&12.1242670011703\times(\text{``}\text{SiN}[\lambda]\text{''})-\\&14.2127713812958\times(\text{``}LT\theta[\text{deg.}]\text{''})^2+\\&0.0787858396593867\times(\text{``}LT\theta[\text{deg.}]\text{''})^3-\\&0.000162271010336368\times(\text{``}LT\theta[\text{deg.}]\text{''})^4+\end{aligned}$$

$$16.0480592141443 \times (\text{"Al}[\lambda]\text{"}) \times (\text{"}LT\theta[\text{deg.}]\text{"}) -$$
$$2.8737040817671 \times (\text{"}LT[\lambda]\text{"}) \times (\text{"}LT\theta[\text{deg.}]\text{"}) -$$
$$3.29244406546554 \times (\text{"}LT\theta[\text{deg.}]\text{"}) \times (\text{"SiO}_2[\lambda]\text{"}) +$$
$$0.00614278417047359 \times \text{"}LT\theta[\text{deg.}]\text{"}) \times (\text{"Si}\psi[\text{deg.}]\text{"})$$
equation 6.

12. The acoustic wave device according to claim 11, wherein the thickness of the IDT electrode, SiN [λ], SiO$_2$ [λ], LT [λ], LTθ [deg.], and Siψ [deg.] are thicknesses and angles in ranges in which the phase of the Rayleigh wave as derived from equation 6 is about −84° or less.

13. A composite filter apparatus comprising:
    a common connection terminal;
    a filter unit including the acoustic wave device according to claim 1 and having a first pass band; and
    a second filter unit connected in common with the first filter unit to the common connection terminal and having a second pass band different from the first pass band; wherein
    a second higher-order mode is excited at a frequency of from about 1.2 times to about 1.7 times the resonant frequency of the acoustic wave device; and
    the frequency of the second higher-order mode is located outside the second pass band.

14. The composite filter apparatus according to claim 13, wherein SiN [λ], SiO$_2$ [λ], LT [λ], and LTθ [deg.] are thicknesses and an angle in ranges in which the phase of the first higher-order mode as derived from equation 1 is about −73° or less.

15. The composite filter apparatus according to claim 13, wherein
    when Euler angles of the silicon substrate are (about −45°, about −54.7°, Siψ [deg.]), about 0°≤Siψ [deg.]≤about 30°, LT [λ]≤about 0.179λ; and
    SiN [λ], SiO$_2$ [λ], LT [λ], LTθ [deg.], and Siψ [deg.] are thicknesses and angles in ranges in which a phase of a second higher-order mode is about −70° or less as derived from equation 2:

$$\text{phase[deg.]} = (-205.883644685925) +$$
$$127.798701342823 \times (\text{"}LT[\lambda]\text{"}) +$$
$$2.15277969099328 \times (\text{"}LT\theta[\text{deg.}]\text{"}) -$$
$$102.612816079968 \times (\text{"SiO}_2[\lambda]\text{"}) -$$
$$0.224847505825644 \times (\text{"Si}\psi[\text{deg.}]\text{"}) -$$
$$51.4047137303909 \times (\text{"SiN}[\lambda]\text{"}) -$$
$$0.00890818181751331 \times (\text{"}LT\theta[\text{deg.}]\text{"})^2 +$$
$$307.622195727849 \times (\text{"SiO}_2[\lambda]\text{"})^2 -$$
$$0.00758239200722899 \times (\text{"Si}\psi[\text{deg.}]\text{"})^2 +$$
$$77.4266396390485 \times (\text{"SiN}[\lambda]\text{"})^2 -$$
$$181.250917094982 \times (\text{"}LT[\lambda]\text{"}) \times (\text{"SiN}[\lambda]\text{"}) +$$
$$1.30355347496229 \times (\text{"Si}\psi[\text{deg.}]\text{"}) \times (\text{"SiN}[\lambda]\text{"})$$
equation 2.

16. The composite filter apparatus according to claim 15, wherein SiN [λ], SiO$_2$ [λ], LT [λ], LTθ [deg.], and Siψ [deg.] are thicknesses and angles in ranges in which the phase of the second higher-order mode as derived from equation 2 is about −82° or less.

17. A composite filter apparatus comprising:
    a common connection terminal;
    a filter unit including the acoustic wave device according to claim 1 and having a first pass band; and
    a second filter unit connected in common with the first filter unit to the common connection terminal and having a second pass band that is a frequency band lower than the first pass band; wherein
    a Rayleigh wave is excited at a frequency lower than the resonant frequency of the acoustic wave device, and
    the frequency of the Rayleigh wave is located outside the second pass band.

18. The composite filter apparatus according to claim 17, wherein SiN [λ], SiO$_2$ [λ], LT [λ], and LTθ [deg.] are thicknesses and an angle in ranges in which the phase of the first higher-order mode as derived from equation 1 is about −73° or less.

19. The composite filter apparatus according to claim 17, wherein
    when Euler angles of the silicon substrate are (about −45°, about −54.7°, Siψ [deg.]), about 0°≤Siψ [deg.]≤about 30°, LT [λ]≤about 0.179λ; and
    SiN [λ], SiO$_2$ [λ], LT [λ], LTθ [deg.], and Siψ [deg.] are thicknesses and angles in ranges in which a phase of a second higher-order mode is about −70° or less as derived from equation 2:

$$\text{phase[deg.]} = (-205.883644685925) +$$
$$127.798701342823 \times (\text{"}LT[\lambda]\text{"}) +$$
$$2.15277969099328 \times (\text{"}LT\theta[\text{deg.}]\text{"}) -$$
$$102.612816079968 \times (\text{"SiO}_2[\lambda]\text{"}) -$$
$$0.224847505825644 \times (\text{"Si}\psi[\text{deg.}]\text{"}) -$$
$$51.4047137303909 \times (\text{"SiN}[\lambda]\text{"}) -$$
$$0.00890818181751331 \times (\text{"}LT\theta[\text{deg.}]\text{"})^2 +$$
$$307.622195727849 \times (\text{"SiO}_2[\lambda]\text{"})^2 -$$
$$0.00758239200722899 \times (\text{"Si}\psi[\text{deg.}]\text{"})^2 +$$
$$77.4266396390485 \times (\text{"SiN}[\lambda]\text{"})^2 -$$
$$181.250917094982 \times (\text{"}LT[\lambda]\text{"}) \times (\text{"SiN}[\lambda]\text{"}) +$$
$$1.30355347496229 \times (\text{"Si}\psi[\text{deg.}]\text{"}) \times (\text{"SiN}[\lambda]\text{"})$$
equation 2.

20. The composite filter apparatus according to claim 19, wherein SiN [λ], SiO$_2$ [λ], LT [λ], LTθ [deg.], and Siψ [deg.] are thicknesses and angles in ranges in which the phase of the second higher-order mode as derived from equation 2 is about −82° or less.

\* \* \* \* \*